United States Patent
Wu et al.

(10) Patent No.: US 11,380,694 B2
(45) Date of Patent: Jul. 5, 2022

(54) LOW-VOLTAGE ANTI-FUSE ELEMENT

(71) Applicant: YIELD MICROELECTRONICS CORP., Chu-Pei (TW)

(72) Inventors: Cheng-Ying Wu, Chu-Pei (TW); Yu-Ting Huang, Chu-Pei (TW); Wen-Chien Huang, Chu-Pei (TW)

(73) Assignee: YIELD MICROELECTRONICS CORP., Chu-Pei (TW)

( * ) Notice: Subject to any disclaimer, the term of this patent is extended or adjusted under 35 U.S.C. 154(b) by 143 days.

(21) Appl. No.: 16/808,505

(22) Filed: Mar. 4, 2020

(65) Prior Publication Data

US 2021/0242223 A1 Aug. 5, 2021

(30) Foreign Application Priority Data

Feb. 4, 2020 (TW) ................................. 109103372

(51) Int. Cl.
*H01L 27/112* (2006.01)

(52) U.S. Cl.
CPC .............................. *H01L 27/11206* (2013.01)

(58) Field of Classification Search
CPC ................................................ H01L 27/11206
See application file for complete search history.

(56) References Cited

U.S. PATENT DOCUMENTS

| 8,933,492 B2 * | 1/2015 | Kurjanowicz | ........ H01L 27/101 257/209 |
| 9,761,595 B2 * | 9/2017 | Rothleitner | ......... H01L 29/4238 |

FOREIGN PATENT DOCUMENTS

| CN | 104009039 A | 8/2014 |
| TW | 201241832 A1 | 10/2012 |
| TW | 201806132 A | 2/2018 |

OTHER PUBLICATIONS

International Search Report Issued by Foreign Patent Office.

* cited by examiner

*Primary Examiner* — Allison Bernstein
(74) *Attorney, Agent, or Firm* — Rosenberg, Klein & Lee

(57) ABSTRACT

A low-voltage anti-fuse element is provided with a first gate dielectric layer and a first gate sequentially disposed on a substrate. A first ion-doped region is formed in the substrate on one side of the first gate. The first gate includes a body portion and a sharp corner portion extending and gradually reducing from one side of the body portion both adjacent to the first gate dielectric layer. During the operation, the principle of higher density of charges at sharp corners is utilized. When the write voltage is applied between the first gate and the first ion-doped region, a portion of the first gate dielectric layer below the sharp corner portion is liable to break down. Therefore, the breakdown voltage is reduced to achieve the purpose of reducing current consumption, while decreasing the gate area, the element size and production costs.

11 Claims, 4 Drawing Sheets

LOW-VOLTAGE ANTI-FUSE ELEMENT

This application claims priority for Taiwan (R.O.C.) patent application no. 109103372 filed on 4 Feb. 2020, the content of which is incorporated by reference in its entirely.

BACKGROUND OF THE INVENTION

Field of the Invention

The present invention relates to a non-volatile memory, particularly to a low-voltage anti-fuse element using an improved gate structure to reduce the breakdown voltage.

Description of the Related Art

Non-volatile memories, such as EEPROM, EEPROM, and flash memory, which features electric programmability and erasability and would not lose its memory after power is turned off, has been widely used in electronic products in the computer and information age. However, the structure of the read-only memory or flash memory described above is relatively complicated. The reliability is relatively low, and the manufacturing cost is high. Therefore, one time programmable memory (OTP) with high reliability and low manufacturing cost can be used in many places. OTP using fuses or anti-fuses as components is more flexible in use.

Traditional fuses mainly include metal fuses and polycrystalline silicon fuses. The writing method mainly uses a high-energy laser or a large current to blow the fuse. The resistance of the fuse will increase after writing, and the power consumption is large. The anti-fuse mainly adds a dielectric layer between the two conductors as a capacitive manner. When writing, a bias voltage is applied to the conductors at both ends, which causes the dielectric layer to be collapsed and broken down. The resistance of the anti-fuse would be decreased after writing. With the rapid development of the integrated circuits, the size of components is shrinking. In recent years, MOS devices have been used to make the anti-fuse elements. The writing method is based on the breakdown mechanism of the gate dielectric layer.

Since the anti-fuse element is based on the breakdown of the gate dielectric layer to form a permanent conductive path, a high voltage must be applied to collapse the gate dielectric layer. A relatively high current is required to achieve breakdown of the gate dielectric layer. Further, when the conventional non-volatile memories, especially embedded products, are fabricated with an advanced process, many additional processes are usually necessary, which increase the difficulties and cost of the fabrication. Therefore, all the advanced processes are endeavoring to develop a low-voltage non-volatile memory.

SUMMARY OF THE INVENTION

In order to overcome the abovementioned problems of the conventional technology, the present invention provides a low-voltage anti-fuse element, wherein the gate on the gate dielectric layer is formed with an extending tapered sharp corner portion. When the operation is performed, the density of the charge at the sharp corner portion is higher to reduce the breakdown voltage and greatly reduce the current required to program the anti-fuse element.

To achieve the abovementioned objectives, the present invention provides a low-voltage anti-fuse element. The low-voltage anti-fuse element includes a substrate, a first gate dielectric layer, a first gate, and a first ion-doped region. The first gate dielectric layer is disposed on the substrate. The first gate includes a body portion and a sharp corner portion extending and gradually reducing from one side of the body portion, and the body portion and the sharp corner portion are adjacent to the first gate dielectric layer. The first ion-doped region is disposed in the substrate on one side of the first gate dielectric layer. An electric field is generated between the first gate and the first ion-doped region when a write voltage is applied between the first gate and the first ion-doped region. The electric field is concentrated at the sharp corner portion. The first gate dielectric layer below the sharp corner portion is liable to cause breakdown, so as to reduce the breakdown voltage.

In an embodiment of the present invention, the substrate is a P-type semiconductor substrate or an N-type semiconductor substrate. While the substrate is a P-type semiconductor substrate, the first ion-doped region is an N-type ion-doped region. While the substrate is an N-type semiconductor substrate, the first ion-doped region is a P-type ion-doped region.

In an embodiment of the present invention, the low-voltage anti-fuse element further includes an access transistor adjacent to the first ion-doped region. The access transistor comprises a second gate dielectric layer, a second gate, and a second ion-doped region. The second gate dielectric layer is disposed on the substrate. The second gate is stacked on the second gate dielectric layer. The second ion-doped region is disposed in the substrate on one side of the second gate dielectric layer away from the first ion-doped region, and the first ion-doped region is doped with the same type ions as the second ion-doped region.

In an embodiment of the present invention, the low-voltage anti-fuse element further includes a well region. The well region is disposed in the substrate and below the first ion-doped region. The well region and the first ion-doped region are doped with different types of ions.

Since the gate structure is designed to have a sharp corner portion, the first gate dielectric layer below the sharp corner portion would be easier to break down due to the principle of higher density of charges at the sharp corner portion. Thereby, a low operating voltage and a low operating current can be used. Moreover, the gate area is reduced to achieve the effect of reducing the size of the component, thus reducing the production cost of the anti-fuse component.

Below, the embodiments are described in detail in cooperation with the drawings to make easily understood the technical contents, characteristics and accomplishments of the present invention.

DETAILED DESCRIPTION OF THE INVENTION

Figure 1:
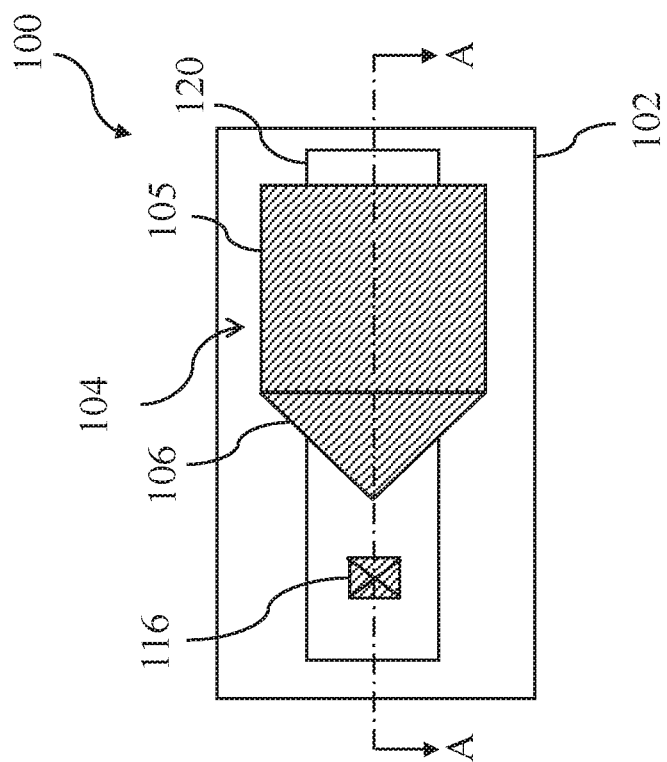
FIG. 1 schematically shows a plan view of a low-voltage anti-fuse element according to a first embodiment of the present invention.
Figure 2:
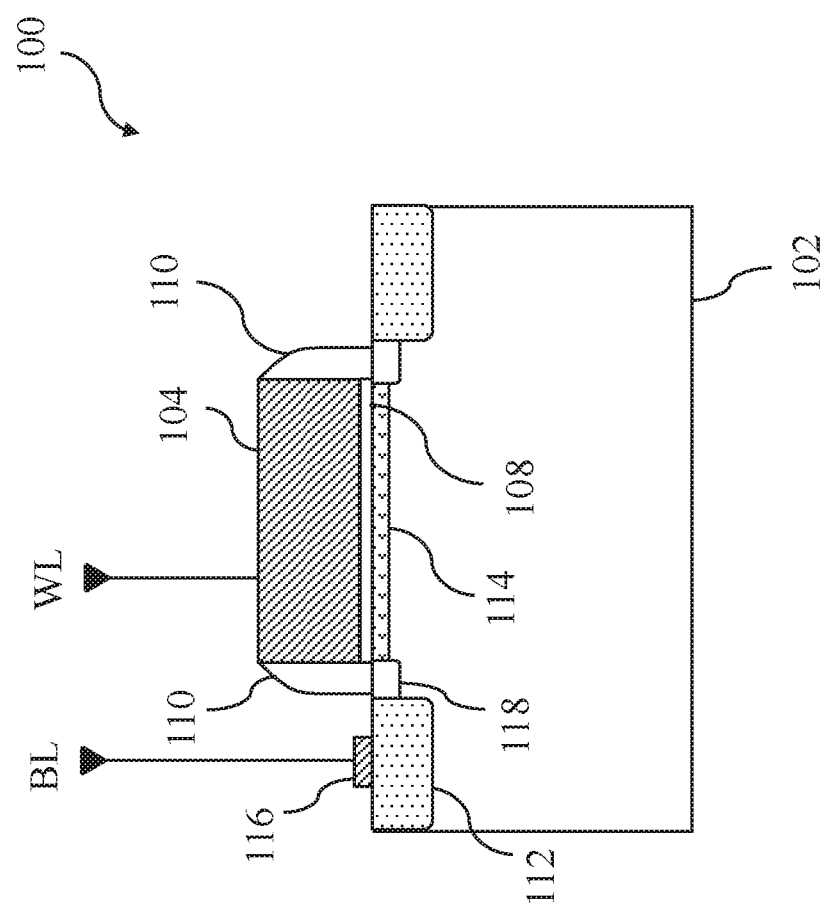
FIG. 2 schematically shows a cross-sectional view of the low-voltage anti-fuse element taken along a line A-A of FIG. 1.

Please refer to FIG. 1, which shows a plan view of a low-voltage anti-fuse element according to a first embodiment of the present invention. Meanwhile, please refer to FIG. 2, which shows a cross-sectional view of the low-voltage anti-fuse element taken along a line A-A of FIG. 1.

In this embodiment, the low-voltage anti-fuse element 100 includes a substrate 102, a first gate 104, a first gate dielectric layer 108, a sidewall spacer 110, a first ion-doped region 112, and a channel region 114, and a bit line contact 116. The first gate dielectric layer 108 is formed on the substrate 102, the first gate 104 is stacked on the first gate dielectric layer 108, and the sidewall spacers 110 are disposed on both sides of the first gate 104. The first ion-doped region 112 is formed in the substrate 102 on one side of the first gate dielectric layer 108 and may have a lightly doped diffusion (LDD) region 118 adjacent to a vertical edge of the first gate dielectric layer 108. The first ion-doped region 112, the LDD region 118 and the channel region 114 are located in the active region 120. Further, the first gate 104 has a body portion 105 and a sharp corner portion 106 formed by extending and tapering from one side of the body portion 105. The body portion 105 and the sharp corner portion 106 are formed above the first gate dielectric layer 108 to contact the first gate dielectric layer 108. More specifically, the shape of the sharp corner portion 106 of the first gate 104 is substantially triangular, and it extends from one side of the body portion 105. The sharp corner portion 106 and the body portion 105 may be made of the same or different materials. The body portion 105 and the sharp corner portion 106 are formed to overlap the active region 120 on the substrate 102. In addition, the number and size of the sharp corner portion 106 are not limited, and a practically preferred number is one, which can be appropriately selected according to a preset write voltage and the thickness of the first gate dielectric layer 108.

In this embodiment, the substrate 102 may be a P-type semiconductor substrate or an N-type semiconductor substrate. While the substrate 102 is a P-type semiconductor substrate, the first ion-doped region 112 is an N-type ion-doped region. While the substrate 102 is an N-type semiconductor substrate, the first ion-doped region 112 is a P-type ion-doped region. The first gate dielectric layer 108 is a gate oxide having a substantially uniform thickness and a relatively thin layer under the first gate 104. The material of the first gate dielectric layer 108 may be selected from the group consisting of an oxide layer, a nitride layer, an oxynitride layer, a metal oxide layer, and the combinations thereof.

In this embodiment, the first gate 104 is connected to the word line WL. The first ion-doped region 112 is connected to the bit line BL via the bit line contact 116 or other lines for sensing the current from the first gate 104 and can be doped to accommodate the programming voltage or current. During a write operation, a write voltage is applied to the first gate 104 through the word line WL, a bit line voltage is applied to the first ion-doped region 112, and an electric field is generated between the first gate 104 and the first ion-doped region 112. By the principle of point discharge, a large amount of charge is concentrated in the sharp corner portion 106 of the first gate 104, and the electric field thereof is stronger. As a result, the write voltage required for a portion of the first gate dielectric layer 108 corresponding to and below the sharp corner portion 106 to collapse is reduced. It is easier to breakdown, and the write time can be shortened.

Figure 3:
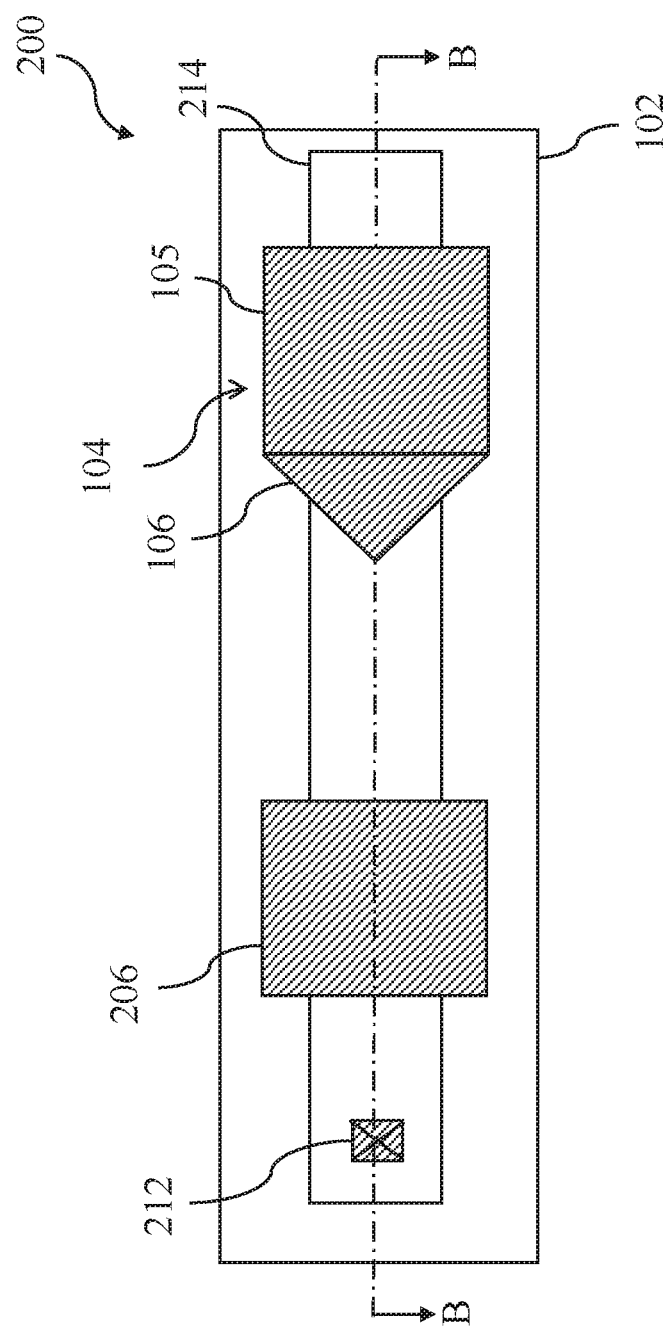
FIG. 3 schematically shows a plan view of a low-voltage anti-fuse element according to a second embodiment of the present invention.
Figure 4:
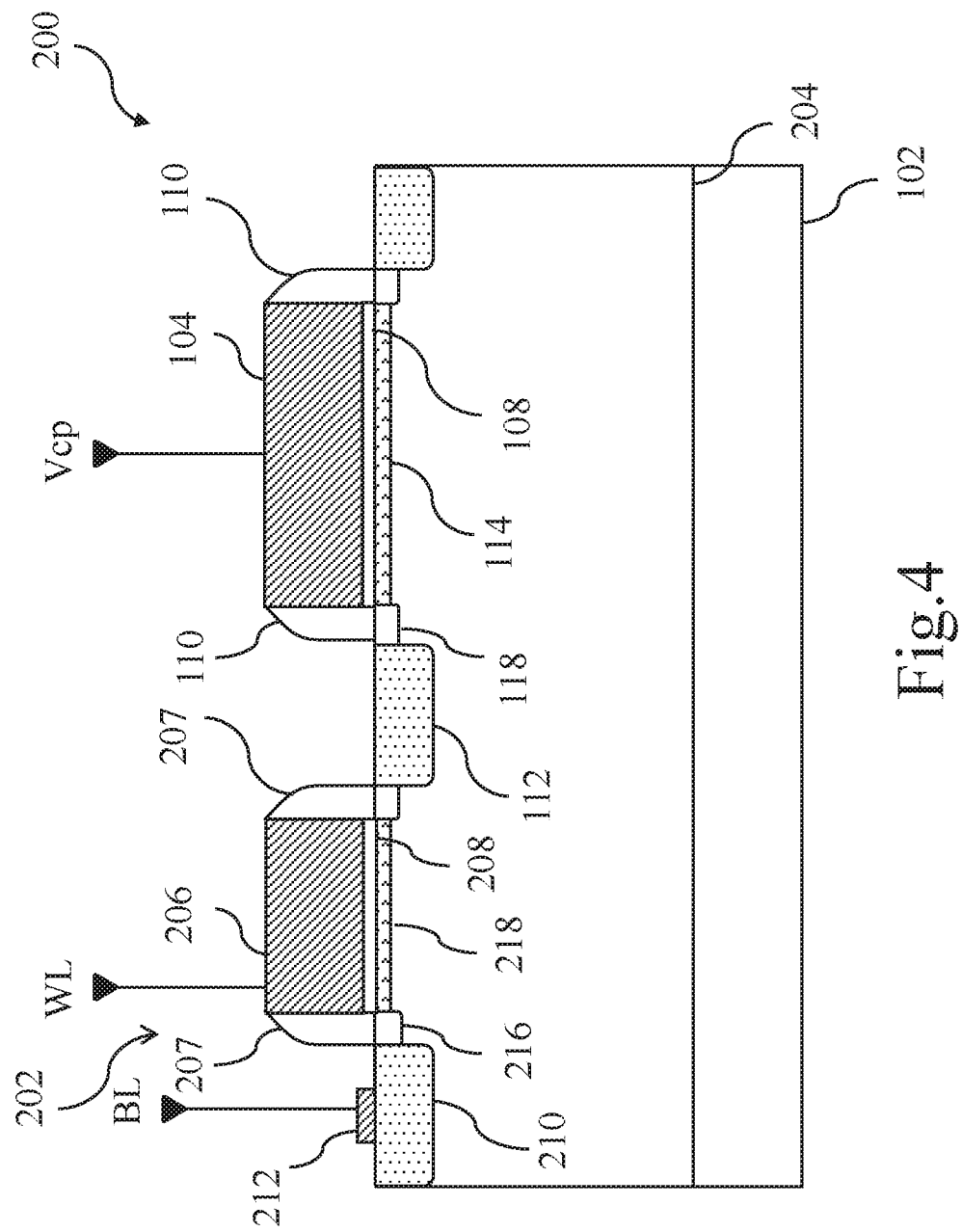
FIG. 4 schematically shows a cross-sectional view of the low-voltage anti-fuse element taken along a line B-B of FIG. 3.

Next, a second embodiment of the present invention will be described with reference to FIG. 3 and FIG. 4. The low-voltage anti-fuse element 200 may be connected in series with an access transistor 202. Please refer to FIG. 3, which shows a plan view of a low-voltage anti-fuse element 200 according to a second embodiment of the present invention. Meanwhile, please refer to FIG. 4, which shows a cross-sectional view of the low-voltage anti-fuse element 200 taken along a line B-B of FIG. 3.

In this embodiment, the low-voltage anti-fuse element 200 includes an access transistor 202 adjacent to the first ion-doped region 112. The anti-fuse structure of the low-voltage anti-fuse element 200 is similar to that shown in FIG. 1 and FIG. 2. Therefore the same previously described components are labeled with the same numbers. More specifically, the structure of the first gate 104 is the same as that shown in FIG. 2, and also has a body portion 105 and a sharp corner portion 106, excepting that the first ion-doped region 112 does not have a bit line contact formed thereon.

The low-voltage anti-fuse element 200 and the access transistor 202 have a well region 204 disposed on the substrate 102, a second gate dielectric layer 208 disposed on the well region 204, a second gate 206 that covers the second gate dielectric layer 208 and has sidewall spacers 207 on both sides thereof, a first ion-doped region 112 formed on one side of the second gate dielectric layer 208, a second ion-doped region 210 formed on another side of the second gate dielectric layer 208. In addition, the second ion-doped region 210 has a bit line contact 212 formed thereon to make electrical contact with a bit line (not shown). The second ion-doped region 210 has a lightly doped diffusion (LDD) region 216 adjacent to a vertical edge of the second gate dielectric layer 208. The well region 204 includes an active region 214. The first ion-doped region 112, the second ion-doped region 210, the LDD region 118, the LDD region 216, the channel region 114, and the channel region 218 are located in the active region 214. The first ion-doped region 112 and the second ion-doped region 210 may be doped with the same type of ions. The first ion-doped region 112 and the well region 204 are doped with different types of ions, and may be different doping concentrations, depending on the desired operating voltage.

In this embodiment, the substrate 102 may be a P-type semiconductor substrate or an N-type semiconductor substrate. While the substrate 102 is a P-type semiconductor substrate, the first ion-doped region 112 and the second ion-doped region 210 are N-type doped regions, and the well region 204 is a P-type doped region. While the substrate 102 is an N-type semiconductor substrate, the first ion-doped region 112 and the second ion-doped region 210 are P-type doped regions, and the well region 204 is an N-type doped region. The first gate dielectric layer 108 is a gate oxide having a substantially uniform thickness and a relatively thin layer under the first gate 104. The material of the first gate dielectric layer 108 may be selected from the group consisting of an oxide layer, a nitride layer, an oxynitride layer, a metal oxide layer, and combinations thereof. The low-voltage anti-fuse elements 100 and 200 of the above embodiments can be manufactured by any standard CMOS process, such as the formation of sidewall spacers, lightly doped diffusion (LDD), and gate deuteration. The second gate dielectric layer 208 of the access transistor 202 is formed at the same time as the first gate dielectric layer 108. Therefore, the second gate dielectric layer 208 and the first gate dielectric layer 108 have substantially the same composition and may have the same or different thicknesses.

The operation of the low-voltage anti-fuse element 200 of this embodiment is similar to that of the low-voltage anti-fuse element 100 of the first embodiment. The second ion-doped region 210 of the access transistor 202 is coupled to the bit line BL to the first ion-doped region 112 via the bit line contact 212. The word line WL is coupled to the second gate 206 of the access transistor 202. The cell screen voltage Vcp is coupled to the first gate 104. When a write operation is performed, a write voltage is applied to the Vcp polysilicon line while maintaining the bit line BL grounded. The access transistor 202 is turned on to couple the first ion doped region 112 to ground via the bit line. As a result, an electric field is generated between the first gate 104 and the first ion-doped region 112. By the principle of point discharge, a large amount of charge is concentrated in the sharp corner portion 106 of the first gate 104, and the electric field thereof is stronger. As a result, the write voltage required for a portion of the first gate dielectric layer 108 corresponding to and below the sharp corner portion 106 to collapse is reduced. It is easier to breakdown, and the write time can be shortened.

According to the low-voltage anti-fuse element provided by the present invention, the gate dielectric layer is broken through to conduct the circuit by applying a voltage. Compared with the conventional anti-fuse element, the shape of the gate above the gate dielectric layer is mostly a square with vertical sides. The charge density is uniform, so it requires high voltage and relatively higher current. The low-voltage anti-fuse element of the present invention designs the gate structure to have a sharp corner portion. When the operation is performed, the density of the charge at the sharp corner portion is higher. Such that the portion of the gate dielectric layer below the sharp corner portion is liable to break down and the breakdown voltage is reduced. The purpose of reducing current consumption is achieved. Furthermore, the gate area can also be reduced, and the effect of reducing the element size and reducing the production cost are achieved.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A low-voltage anti-fuse element, comprising: a substrate; a first gate dielectric layer disposed on said substrate; a first gate including a body portion and a sharp corner portion extending and gradually reducing from one side of said body portion, wherein said body portion and said sharp corner portion are adjacent to said first gate dielectric layer, wherein said first gate is connected to a word line; and a first ion-doped region disposed in said substrate on one side of said first gate dielectric layer, wherein said first ion-doped region is connected to a bit line; wherein during a write operation, a write voltage is applied to the first gate through the word line, a bit line voltage is applied to the first ion-doped region, and an electric field is generated between said first gate and said first ion-doped region, and said electric field is concentrated at said sharp corner portion, so that a portion of said first gate dielectric layer below said sharp corner portion is liable to cause breakdown, wherein the sharp corner portion is protruded outwardly from the side of the body portion.

2. The low-voltage anti-fuse element according to claim 1, wherein said substrate is a P-type semiconductor substrate or an N-type semiconductor substrate.

3. The low-voltage anti-fuse element according to claim 1, wherein said substrate is a P-type semiconductor substrate, said first ion-doped region is an N-type ion-doped region.

4. The low-voltage anti-fuse element according to claim 1, wherein said substrate is an N-type semiconductor substrate, said first ion-doped region is a P-type ion-doped region.

5. The low-voltage anti-fuse element according to claim 1 further comprising an access transistor adjacent to said first ion-doped region, wherein said access transistor comprises:
a second gate dielectric layer disposed on said substrate;
a second gate stacked on said second gate dielectric layer; and
a second ion-doped region disposed in said substrate on one side of said second gate dielectric layer away from said first ion-doped region, wherein said first ion-doped region is doped with the same type ions as said second ion-doped region.

6. The low-voltage anti-fuse element according to claim 5, wherein said second gate dielectric layer and said first gate dielectric layer have substantially the same composition and the same thickness.

7. The low-voltage anti-fuse element according to claim 5, wherein said second gate dielectric layer and said first gate dielectric layer have substantially the same composition and different thicknesses.

8. The low-voltage anti-fuse element according to claim 5, wherein said second ion-doped region is connected to a bit line.

9. The low-voltage anti-fuse element according to claim 1, wherein said first gate dielectric layer has a uniform thickness under said first gate.

10. The low-voltage anti-fuse element according to claim 1, wherein said first gate dielectric layer is selected from the group consisting of an oxide layer, a nitride layer, an oxynitride layer, a metal oxide layer, and the combinations thereof.

11. The low-voltage anti-fuse element according to claim 1, further comprising a well region disposed in said substrate and below said first ion-doped region, and said well region and said first ion-doped region are doped with different types of ions.

* * * * *